United States Patent [19]

Okumura

[11] Patent Number: 5,536,957
[45] Date of Patent: Jul. 16, 1996

[54] MOS FIELD EFFECT TRANSISTOR HAVING SOURCE/DRAIN REGIONS SURROUNDED BY IMPURITY WELLS

[75] Inventor: Yoshinori Okumura, Hyogo-ken, Japan

[73] Assignee: Mitsubishi Denki Kabushiki Kaisha, Tokyo, Japan

[21] Appl. No.: 637,431

[22] Filed: Jan. 4, 1991

[30] Foreign Application Priority Data

Jan. 16, 1990 [JP] Japan .......................................... 2-7600
Sep. 25, 1990 [JP] Japan .................................... 2-256655

[51] Int. Cl.⁶ ................................................. H01L 29/78
[52] U.S. Cl. ........................... 257/336; 257/344; 257/403; 257/404
[58] Field of Search ........................ 357/23.4; 257/334, 257/344, 403, 404

[56] References Cited

U.S. PATENT DOCUMENTS

| | | | |
|---|---|---|---|
| 3,437,891 | 4/1969 | Yamashita | 317/235 |
| 3,821,776 | 6/1974 | Hayashi et al. | 357/23.4 |
| 3,988,761 | 10/1976 | Kanazawa | 357/23.4 |
| 4,597,824 | 7/1986 | Shinada | 156/643 |
| 4,924,277 | 5/1990 | Yamane et al. | 357/23.4 |
| 4,931,408 | 6/1990 | Hshieh | 357/23.4 |
| 4,979,001 | 12/1990 | Alter | 357/23.4 |
| 4,990,978 | 2/1991 | Kondoh | 357/23.4 |

FOREIGN PATENT DOCUMENTS

| | | |
|---|---|---|
| 0071335 | 2/1983 | European Pat. Off. . |
| 0248292 | 12/1987 | European Pat. Off. . |
| 0387722 | 9/1990 | European Pat. Off. . |
| 3018988 | 11/1981 | Germany . |
| 2-31463 | 2/1990 | Japan . |
| 2-9174 | 12/1990 | Japan . |

OTHER PUBLICATIONS

"A New Twin-Well CMOS Process Using Nitridized-Oxide-LOCOS (NOLOCOS) Isolation Technology", Tsai et al., IEEE Electron Device Letters, vol. 10, No. 7, Jul. 1989.

*Primary Examiner*—Sara W. Crane
*Attorney, Agent, or Firm*—Lowe, Price, LeBlanc & Becker

[57] ABSTRACT

Disclosed is a MOSFET for controlling the flow of a large number of carriers from one source/drain region to the other source/drain region by applying a voltage to a gate. This MOSFET includes a semiconductor substrate and a transistor. The transistor includes a gate provided on the semiconductor substrate, one source/drain region and the other source/drain region both having a first conductivity type. The MOSFET includes first and second wells of a second conductivity type formed apart from each other on opposite sides of the gate in the main surface of the semiconductor substrate. The first well is such a small well as to accommodate only one source/drain region, while the second well is such a small well as to accommodate only the other source/drain region. The one source/drain region and the other source region are formed in the first and second wells, respectively. No distortion due to thermal stresses remains in the resultant MOSFET, and consequently a highly reliable MOSFET is obtained.

1 Claim, 18 Drawing Sheets

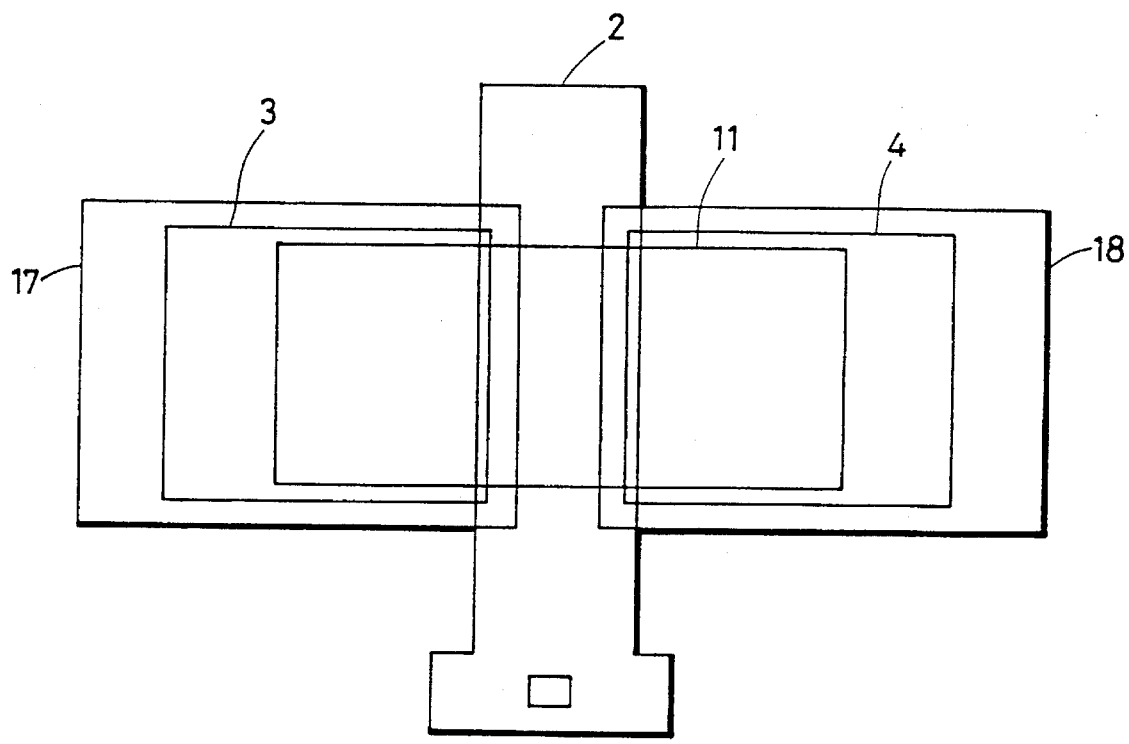

FIG.14A
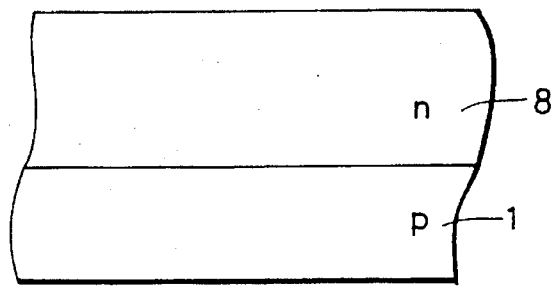
FIG.14B
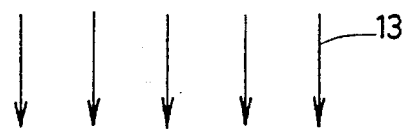
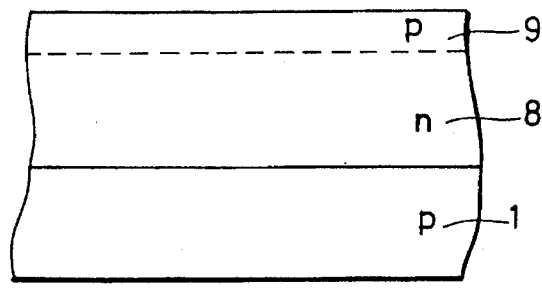
FIG.14C
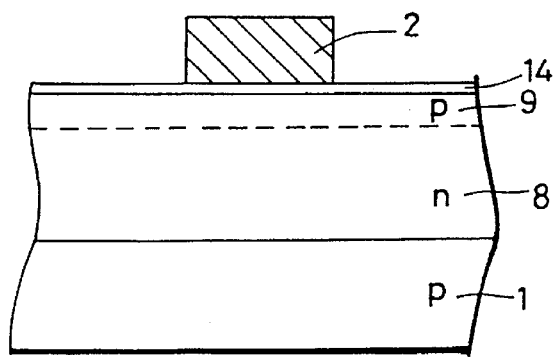

5,536,957

MOS FIELD EFFECT TRANSISTOR HAVING SOURCE/DRAIN REGIONS SURROUNDED BY IMPURITY WELLS

BACKGROUND OF THE INVENTION

1. Field of the Invention

The present invention relates generally to Metal-Oxide-Semiconductor (MOS) field effect transistors and, more particularly, to an improved MOS field effect transistor in which no distortion occurs in a semiconductor substrate, and further to a method of manufacturing such a MOS field effect transistor.

2. Description of the Background Art

MOS field effect transistors (hereinafter referred to as MOSFETs) serve as devices for controlling the flow of a large number of carriers by a voltage to be applied to gates in such a manner as to regulate the amount of water by opening/closing a valve of a water pipe.

FIG. 11 is a cross-sectional view showing a fundamental structure of a conventional MOSFET. Referring to FIG. 11, a gate 2 is provided on a semiconductor substrate 1. A source 3 and a drain 4 are formed on the opposite sides of gate 2, respectively, in a main surface of semiconductor substrate 1. With a voltage to be applied to gate 2, a channel region 5 directly beneath gate 2 is inverted to render source 3 and drain 4 conductive. In the MOSFET having the above-described structure, when a channel length is short, a depletion layer 6 in the vicinity of drain 4 extends over source region 3, so that a current fails to be controlled by the voltage of gate 2. This phenomenon is called a punch-through of MOSFET. In FIG. 11, a portion denoted with a reference number 7 is an end portion of the depletion layer.

In order to prevent this punch-through, such a semiconductor device has been proposed that MOSFETs are formed in wells. FIG. 12A is a cross-sectional view of a conventional semiconductor device in which a buried channel MOSFET is formed in a well formed in a semiconductor substrate. FIG. 13 is a plan view of the semiconductor device shown in FIG. 12A. Referring to these figures, an n type impurity diffusion layer 8 called "a well" is formed in a main surface of a p⁻ semiconductor substrate 1. The definition of p type and n type will be described later. An impurity layer 9 for controlling a threshold voltage is provided in a surface portion of impurity diffusion layer 8. A gate 2 implanted with n type impurity ions is provided on semiconductor substrate 1. A source 3 and a drain 4 formed with diffused p type impurities are provided on the opposite sides of gate 2 in impurity diffusion layer 8. A field oxide film 10 provided in the main surface of semiconductor substrate 1 serves to isolate an elementary device region 11 from the other elementary device regions. In the conventional MOSFET thus structured, since source 3 and drain 4 are formed in the well having the opposite conductivity type (n type impurity diffusion layer 8), even a shorter channel length does not cause the depletion layer in the vicinity of drain 4 to extend over source region 3, resulting in an effective protection of punch-through.

A brief description will be given of the buried channel MOSFET of FIG. 12A.

FIG. 12B is a graph showing the distribution of the number of ions existing in the main surface of the semiconductor substrate, plotted with respect to a distance in the direction of a channel length. In the graph, a longitudinal axis denotes the number of ions defined in the following, and a lateral axis denotes the distance in the direction of the channel length.

$N = n_N - n_P$ $P = n_P - n_N$

In the above expressions, $n_N$ and $n_P$ denote the number of n type atoms and that of p type atoms, respectively. If the relation $n_N - n_P > 0$ is satisfied in a certain region, $N > 0$ is satisfied. This region is an n type impurity region from the viewpoint of metallurgy. If the relation $n_P - n_N > 0$ is satisfied in a region, $P > 0$ is satisfied. This region is a p type impurity region from the viewpoint of metallurgy.

With reference to FIGS. 12A and 12B, a portion directly beneath gate 2, i.e., a channel region is of p⁻ type metallurgically. Thus, source 3 and drain 4 appear to be conductive already at first sight even if no voltage is applied to gate 2. However, gate 2 is implanted with n type impurities, and hence this electric field causes the potential of the channel region to be of n type, with reference to FIG. 12C. More specifically, source region 3 and drain region 4 are electrically isolated from each other, with n type gate 2 mounted on semiconductor substrate 1. Applying a positive voltage to gate 2 causes the potential of the channel region to be of p type and renders source region 3 and drain region 4 conductive.

A method of manufacturing the conventional MOSFET shown in FIG. 12A will now be described with reference to FIGS. 14A–14E.

Referring to FIG. 14A, n type impurity ions 12 (phosphorus) are implanted into the overall surface of a p type semiconductor substrate 1 (boron, $1 \times 10^{15} \text{cm}^{-3}$). The ion-implanted substrate is then subjected to a thermal diffusion at 1000° C. or more for 10 hours, thereby to form an n type impurity diffusion layer 8 (phosphorus, $1 \times 10^{16} \text{cm}^{-3}$), which is called a well, in the main surface of semiconductor substrate 1.

Then, p type impurity ions 13 (boron) are implanted into the overall surface of impurity diffusion layer 8, thereby to form an impurity layer 9 for controlling a threshold voltage (boron, $1 \times 10^{17} \text{cm}^{-3}$) in the surface of impurity diffusion layer 8, as shown in FIG. 14B.

Referring to FIG. 14C, semiconductor substrate 1 undergoes a thermal oxidation processing, whereby a gate oxide film 14 is formed on the surface of semiconductor substrate 1. Thereafter, an electrode material containing n type impurity ions (not shown) is deposited on gate oxide film 14 and then patterned in a predetermined form, thereby to form an n type gate 2.

An oxide film (not shown) is then deposited on the overall surface of semiconductor substrate 1 including gate 2, and then subjected to an anisotropical etching, thereby forming sidewall spacers 15 on sidewalls of gate 2, with reference to FIG. 14D.

As shown in FIG. 14E, with gate 2 and sidewall spacers 15 used as mask, p type impurity ions 16 (boron) are implanted into the surface of semiconductor substrate 1, so as to form a source region 3 (boron $1 \times 10^{20} \text{cm}^{-3}$) and a drain region 4 (boron, $1 \times 10^{20} \text{cm}^{-3}$) in the surface of impurity diffusion layer 8.

An interlayer insulation film is then formed (not shown) on the overall surface of semiconductor substrate 1 including gate 2. Thereafter, a contact hole is formed in this interlayer insulation film, and then an aluminum interconnection is formed, thereby forming an MOSFET.

The conventional MOSFET structured in the above-described manner must be subjected to a heat treatment at a high temperature of 1000° C. or more in order to form n type impurity diffusion layer 8 to be the well, with reference to FIGS. 12A and 14A. This high-temperature heat treatment produces stresses in semiconductor substrate 1 due to thermal stresses which remain as residual stresses in the semiconductor substrate even if the temperature returns to a normal temperature. The residual stresses cause a distortion of semiconductor substrate 1. A tendency that the semiconductor substrate is distorted by the residual stresses increases as the semiconductor substrate has a larger diameter. The distortion of the semiconductor substrate results in the occurrence of unevenness and unstableness in process between central portion and peripheral portion of the semiconductor substrate. Consequently, the difference in characteristic of the device occurs between the central portion and the peripheral portion of the semiconductor substrate, leading to a disadvantage of causing a decrease in yield of the device.

SUMMARY OF THE INVENTION

One object of the present invention is to provide an improved MOS field effect transistor generating no punch-through.

Another object of the present invention is to provide an improved MOS field effect transistor neither producing a punch-through nor having residual stresses.

A further object of the present invention is to provide an improved MOS field effect transistor requiring a lower threshold voltage.

A still further object of the present invention is to provide an improved MOS field effect transistor requiring a shorter delay time.

A still further object of the present invention is to provide an improved MOS field effect transistor of an LDD structure neither producing a punch-through nor having residual stresses.

A still further object of the present invention is to provide an improved method of manufacturing an improved MOS field effect transistor having a well, which requires no processing step of a high-temperature heat treatment.

A still further object of the present invention is to improve a method of manufacturing a MOS field effect transistor having a well so as to obtain a larger diameter of wafer.

A still further object of the present invention is to provide an improved method of manufacturing a MOS field effect transistor having a well, in which no difference in characteristics of a device occurs between central portion and peripheral portion of a semiconductor substrate.

A still further object of the present invention is to provide an improved method of manufacturing a MOS field effect transistor which requires a shorter delay time.

A MOS field effect transistor according to a first aspect of the present invention is a device for controlling the flow of a large number of carriers from one source/drain region to the other source/drain region by applying a voltage to a gate. This field effect transistor includes a semiconductor substrate having a main surface and a transistor for controlling the flow of a large number of carriers. The transistor includes a gate provided on the semiconductor substrate, one source/drain region and the other source/drain region both having a first conductivity type. The field effect transistor further includes a first well and a second well both having a second conductivity type formed distantly from each other on the opposite sides of the gate in the main surface of the semiconductor substrate. The first well is formed to enclose the one source/drain region. The second well is formed to enclose the other source/drain region.

A MOS field effect transistor according to a second aspect of the present invention includes a semiconductor substrate having a main surface. An n type gate is formed on the semiconductor substrate. A pair of p type source/drain regions are formed on the opposite sides of the gate in the main surface of the substrate. A channel region is formed directly beneath the gate and in the main surface of the semiconductor substrate. The channel region is divided into a central portion and a pair of end portions formed to interpose the central portion therebetween. The conductivity type of the central portion is more biased to p type than that of the end portions.

A manufacturing method according to a third aspect of the present invention is directed to a method of manufacturing a MOS field effect transistor having a gate, one source/drain region and the other source/drain region. First of all, a semiconductor substrate having a main surface is provided. The gate is then formed on the main surface of the semiconductor substrate. Thereafter, with the gate used as mask, impurity ions of the second conductivity type are implanted into the main surface of the semiconductor substrate employing a rotary ion implantation method, whereby a first well and a second well both having the second conductivity type are formed on the opposite sides of the gate in the main surface of the semiconductor substrate. The first well is so small as to accommodate only one source/drain region. The second well is so small as to accommodate only the other source/drain region. Thereafter, with the gate employed as mask, impurity ions of the first conductivity type are implanted into the main surface of the semiconductor substrate, whereby the one source/drain region and the other source/drain region are formed in the first well and the second well, respectively.

In accordance with a preferred manner of the embodiment of a method of manufacturing a MOS field effect transistor according to the third aspect of the present invention, the above-described rotary ion implantation method includes the steps of: generating a beam of the impurity ions, providing the semiconductor substrate so as not to cross at right angles to the beam of impurity ions, and rotating the semiconductor substrate.

A method according to a fourth aspect of the present invention is directed to a method of manufacturing a MOS field effect transistor having a gate, one source/drain region and the other source/drain region. First of all, a semiconductor substrate of a first conductivity type having a main surface is prepared. Impurity ions of a second conductivity type are then implanted into the main surface of the semiconductor substrate with an energy which provides an impurity profile having a maximal concentration at distant portion from the main surface, thereby to form a second conductivity type impurity layer in the semiconductor substrate. The gate is then formed on the main surface of the substrate. Thereafter, with the gate used as mask, the second conductivity type impurity ions are implanted into the main surface of the semiconductor substrate by the rotary ion implantation method, whereby a first well and a second well are formed extending from the main surface of the substrate into the second conductivity type impurity layer. The first well is so small as to accommodate the one source/drain region. The second well is so small as to accommodate the other source/drain region. First conductivity type impurity ions are thereafter implanted into the main surface of the semiconductor substrate, with the gate employed as mask, whereby the one source/drain region and the other source/drain region are formed in the first and second wells, respectively.

In accordance with a preferred manner of the embodiment of the method according to the fourth aspect of the present invention, the first conductivity type impurity ions are implanted onto the main surface of the semiconductor substrate prior to the formation of the second conductivity type impurity layer in the semiconductor substrate.

In accordance with the MOS field effect transistor according to the first aspect of the present invention, since the wells to be formed in order to prevent a punch-through are small enough to accommodate only the source/drain regions, the high-temperature heat treatment which has conventionally been required to form large wells becomes unnecessary. Therefore, the resultant MOS field effect transistor has no remaining distortion due to thermal stresses. Consequently, the MOS field effect transistor becomes a highly reliable device.

In the MOS field effect transistor according to the second aspect of the present invention, since the conductivity type of the central portion of the channel region is more biased to p type than that of the end portions, an operation speed becomes partially increased at the central portion of the channel region, leading to an increase in the operation speed of the transistor as a whole.

In accordance with the method of manufacturing the field effect transistor according to the third aspect of the present invention, since the wells to be formed in order to prevent the punch-through are small enough to accommodate only the source/drain regions, the high-temperature heat treatment step which has been conventionally required to form large wells becomes unnecessary. This enables inhibition of a distortion produced in the semiconductor substrate and hence causes no difference in characteristics of the device between the central portion and the peripheral portion of the semiconductor substrate. This results in enhancement in yield of the device.

In accordance with the method of manufacturing the MOS field effect transistor according to the fourth aspect of the present invention, the second conductivity type impurity ions are implanted into the main surface of the first conductivity type semiconductor substrate with the energy which provides the impurity profile having the maximal concentration at a deeper portion from the main surface, thereby to form the second conductivity type impurity layer in the semiconductor substrate. Accordingly, the first conductivity type impurities serving as impurities for setting a threshold value are left in the main surface of the semiconductor substrate. Thus, the step of implanting the impurity ions for setting a threshold value becomes no longer required, thereby leading to simplification of the entire process. The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a plan view of the MOS field effect transistor shown in FIG. 1A;

FIGS. 14A–14E are cross-sectional views showing the processing steps in a conventional method of manufacturing the conventional MOS field effect transistor showing in FIG. 12A.

DESCRIPTION OF THE PREFERRED EMBODIMENTS

The embodiments of the present invention will now be described with reference to the figures.

Figure 1A:
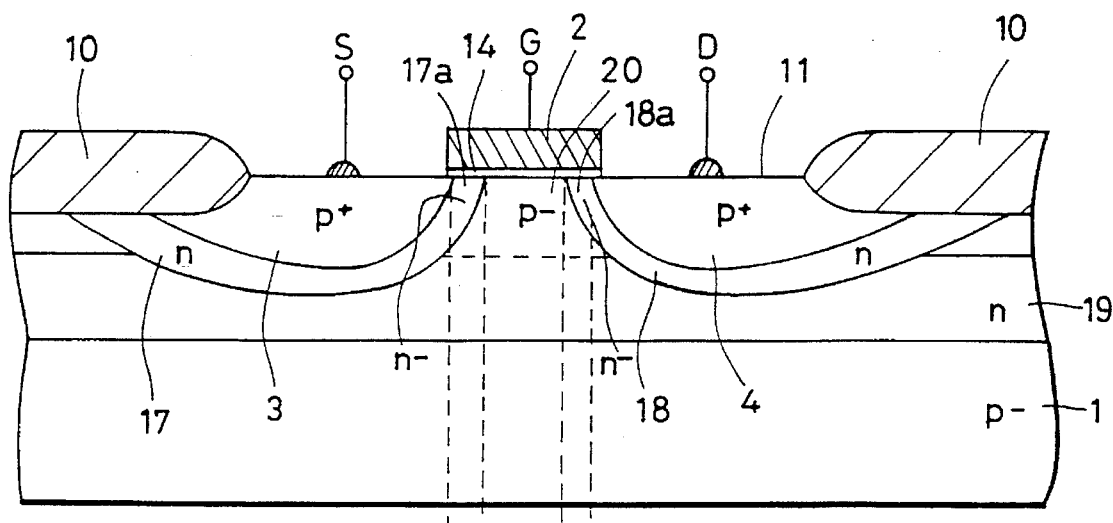
FIG. 1A is a cross-sectional view of a MOS field effect transistor according to one embodiment of the present invention.
Figure 1B:
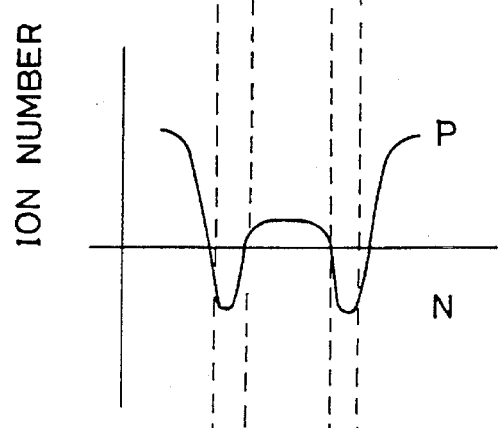
FIG. 1B is a diagram showing the distribution of the number of ions, plotted with respect to a distance in the direction of a channel length.
Figure 1C:
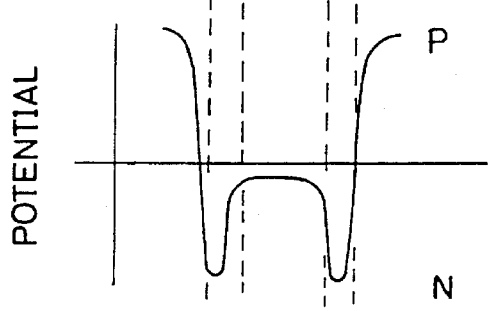
FIG. 1C is a diagram showing the distribution of potential, plotted with respect to a distance in the direction of a channel length.

FIG. 1A is a cross-sectional view of a buried channel MOS field effect transistor according to one embodiment of the present invention, and FIG. 2 is a plan view thereof. FIG. 1B is a plot of the distribution of the number of ions existing in a main surface of a semiconductor substrate, which is plotted relative to a distance in the direction of a channel length. FIG. 1C is a plot of the distribution of potential in the main surface of the substrate, which is plotted relative to the distance in the direction of the channel length. The definition of the number of ions (N, P) is already given in the foregoing.

Referring to those figures, a gate 2 is provided on a p⁻ semiconductor substrate 1 with a gate oxide film 14 sandwiched therebetween. The gate 2 is implanted with n type impurity ions. A first well 17 and a second well 18 both being n type impurity regions are formed on the opposite sides of gate 2 in a main surface of semiconductor substrate 1. The first well 17 has a portion 17a overlapped with gate 2, while the second well 18 has a portion 18a overlapped with gate 2.

A source region 3 being a p type impurity diffusion layer is formed in the first well 17 in the main surface of semiconductor substrate 1. A drain region 4 being a p type impurity diffusion layer is formed in the second well 18 in the main surface of semiconductor substrate 1. An n type impurity diffusion layer 19 is formed in semiconductor substrate 1 beneath the first and second wells 17 and 18. p⁻ impurity ions are introduced into a portion directly beneath gate 2, i.e., a region 20 located between the first and second wells 17 and 18. A field oxide film 10 provided in the main surface of semiconductor substrate 1 serves to isolate an elementary device region 11 from the other elementary device regions.

An operation of this embodiment will now be described.

Referring to FIGS. 1A and 1B, overlapped potions 17a and 18a are N⁻ impurity regions, and region 20 located between the first and second wells 17 and 18 is a p⁻ impurity region on the basis of metallurgy. However, gate 2 is implanted with the n type impurity ions, and hence the electric field of this gate causes overlapped portions 17a and 18a to be of an n type potential and thus causes region 20 to be slightly biased to n type, with reference to FIG. 1C. That is, source region 3 and drain region 4 are electrically isolated from each other with n type gate 2 mounted on semiconductor substrate 1, with reference to FIGS. 1A and 1C. With a voltage to be applied to gate 2, the potential of a channel region (17a, 20, 18a) is inverted to be of p type, so that source 3 and drain 4 are rendered conductive.

In the MOSFET structured in the foregoing manner, since source 3 and drain 4 are formed in the first and second wells 17 and 18, respectively, a depletion layer in the vicinity of drain 4 does not extend over source region 3, leading to an effective protection of a punch-through. Since the first and second wells 17 and 18 to be formed for preventing the punch-through are small enough to accommodate only source/drain regions 3 and 4, respectively, a high-temperature heat treatment which has been conventionally required for formation of a large well is no longer required. Thus, no more distortion due to thermal stresses is left in the resultant MOSFET. Consequently, the MOSFET becomes a highly reliable device. The p type impurity ions, which are introduced into a central portion (20) of the channel, cause an operation speed to be increased partly at the central portion and enables a decrease of a threshold voltage $V_{TH}$ and thus a reduction in delay time of the transistor. The n type impurity diffusion layer 19 existing in semiconductor substrate 1 causes no currents to leak from region 20 beneath the gate toward the bottom portion of p type semiconductor substrate 1 even though source and drain regions 3 and 4 are rendered conductive.

A description will be given on a method of manufacturing the MOSFET shown in FIG. 1A with reference to FIGS. 3A–3D.

Figure 3A:
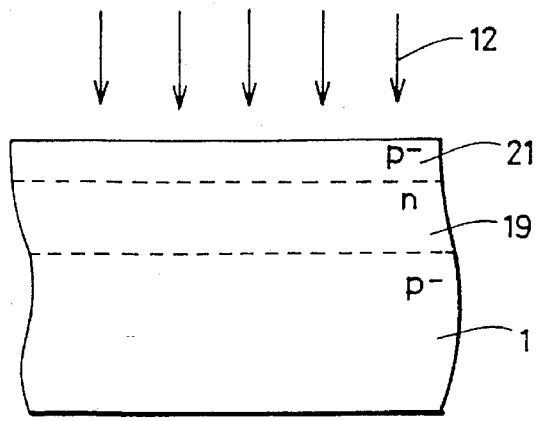
FIGS. 3A–3D are cross-sectional views showing the steps of manufacturing the MOS field effect transistor shown in FIG. 1A.

Referring to FIG. 3A, n type impurity ions 12 (phosphorus) are implanted with an energy of 400–500 KeV into the surface of a p⁻ semiconductor substrate 1 (boron, $1\times10^{15}cm^{-3}$). Thereafter, a heat treatment is carried out at a temperature of 900° C. or lower for 30–60 minutes. This results in formation in semiconductor substrate 1, an n type impurity layer 19 (phosphorus, $1\times10^{17}cm^{-3}$) having an impurity profile being of the maximal concentration at a deeper portion from the main surface of the substrate, with reference to FIGS. 3A and 4A. In this case, a p type impurity layer 21 having the same impurity concentration (boron, $1\times10^{15}cm^{-3}$) as that of semiconductor substrate 1 is left in the main surface of semiconductor substrate 1.

Figure 3B:
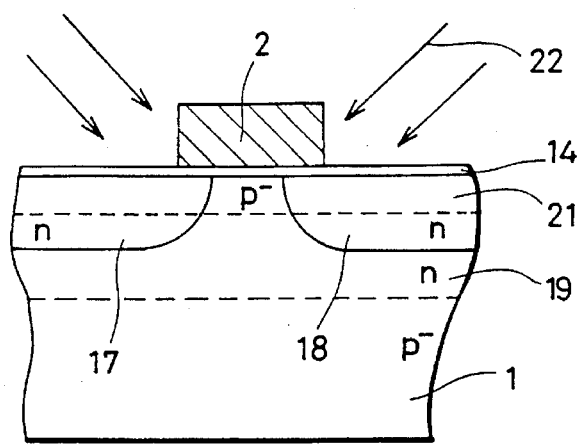

Then, a gate oxide film 14 is formed on semiconductor substrate 1, as shown in FIG. 3B. Thereafter, an n type polysilicon layer is deposited on gate oxide film 14 by a CVD method employing phosphine and silane gas. A subsequent patterning of this n type polysilicon layer in a predetermined form leads to formation of gate 2. Then, n type impurity ions 22 (phosphorus) are implanted into the main surface of the substrate by employing an oblique rotary ion implantation method, with gate 2 used as mask. An implantation energy at this time is 120–180 KeV. This results in formation of first and second small wells 17 and 18 of n type (phosphorus, $1\times10^{17}cm^{-3}$) extending from the main surface of the substrate into n type impurity layer 19.

Figure 5:
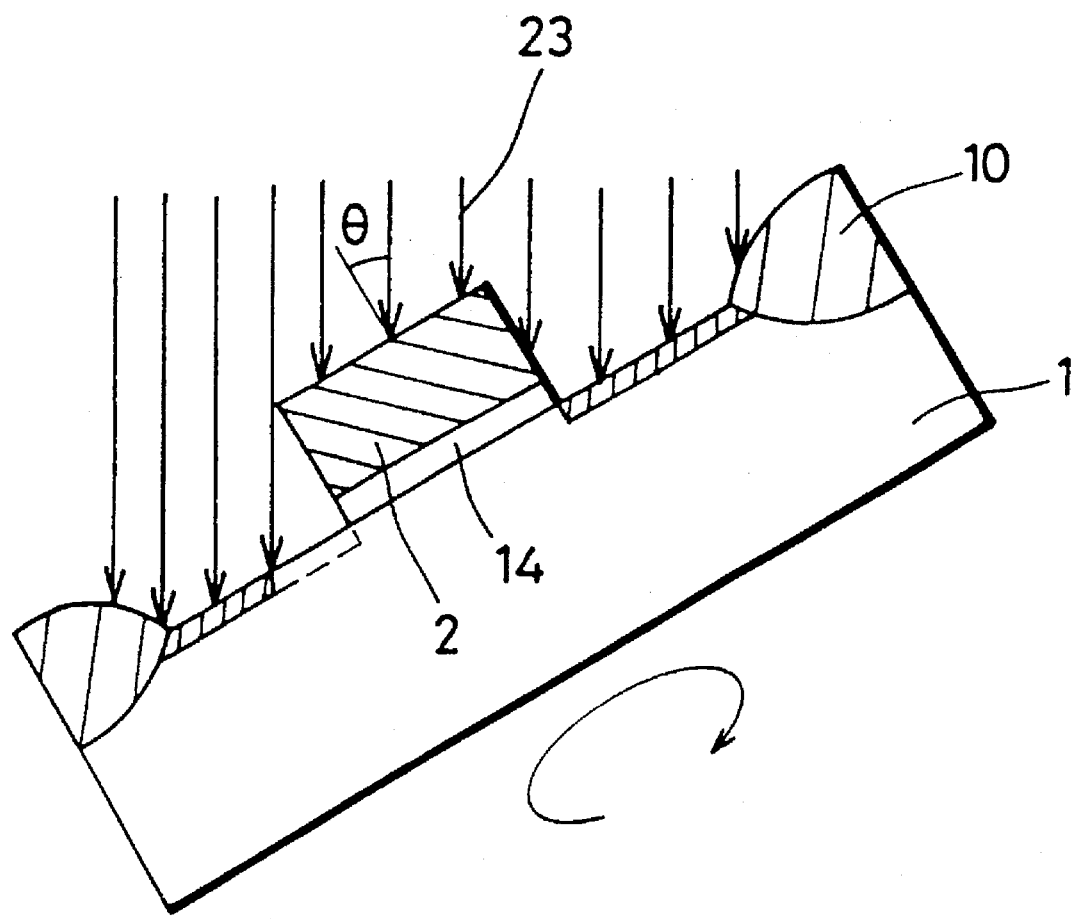
FIG. 5 is a schematic diagram showing a method of rotary ion implantation.

This oblique rotary ion implantation is carried out by a method shown in FIG. 5. More specifically, semiconductor substrate 1 is provided so as not to cross at right angles to an impurity ion beam 23. Then, impurity ion beam 23 is directed onto the surface of semiconductor substrate 1 while rotating semiconductor substrate 1. An inclination Q is preferably in the range of 15°–60°.

Figure 3C:
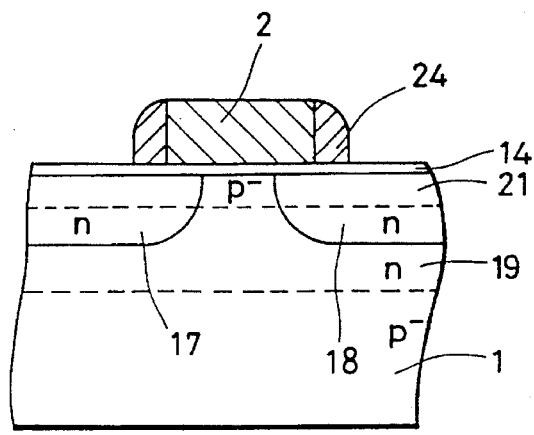

Next, an oxide film is deposited over the whole surface of semiconductor substrate 1 including gate 2, as shown in FIG. 3C. Thereafter, an etch back of this oxide film by anisotropical etching forms sidewall spacers 24 on sidewalls of gate 2.

Figure 3D:
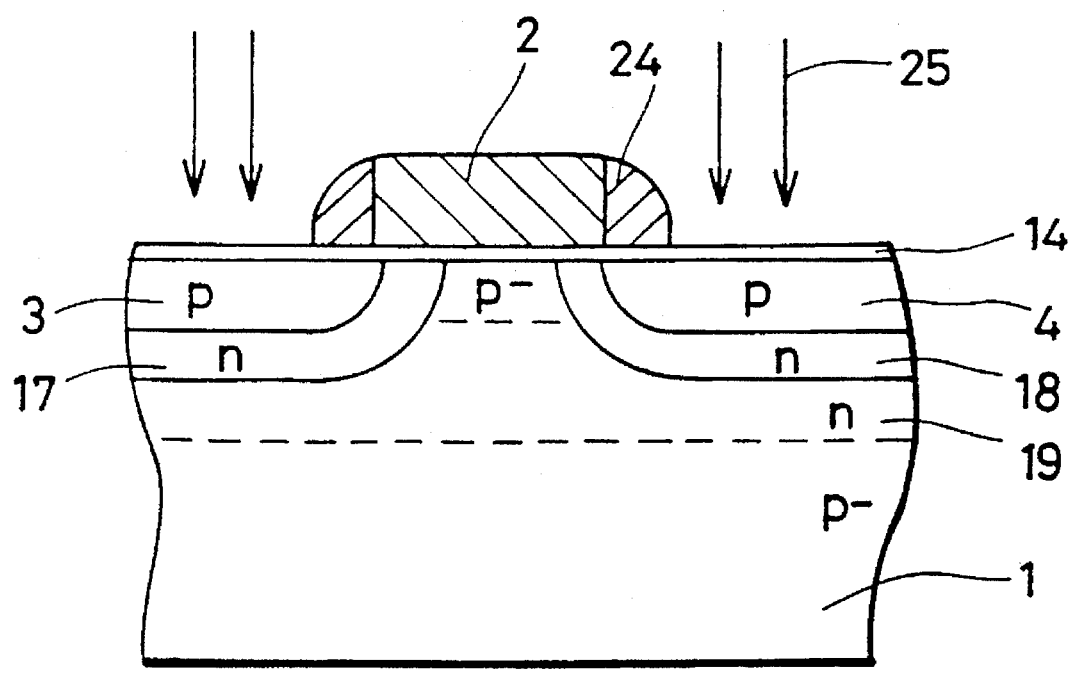

Referring to FIG. 3D, p type impurity ions 25 (boron) are implanted onto the overall surface of semiconductor substrate 1, whereby p type source region 3 (boron, $1\times10^{20}cm^{-3}$) and p type drain region 4 (boron, $1\times10^{20}cm^{-3}$) are formed in first and second wells 17 and 18, respectively.

Next, an interlayer insulation film, not shown, is formed over the whole surface of semiconductor substrate 1. A contact hole and then an aluminum interconnection are formed in this interlayer insulation film, thereby to form the MOSFET shown in FIG. 1.

According to this method, since first and second wells 17 and 18 are small enough to accommodate source and drain regions 3 and 4, respectively, the high-temperature heat treatment step which has been conventionally required to form large wells is no longer required. This makes it possible to inhibit generation of a distortion in semiconductor substrate 1 and thus to cause no difference in characteristics of the device between the central portion and the peripheral portion of semiconductor substrate 1. This results in enhancement in yield of the device. Since no distortion occurs in the semiconductor according to this method, the wafer can obtain a larger diameter.

FIGS. 6A–6D are cross-sectional views showing the processing steps in another method of manufacturing the MOSFET shown in FIG. 1A.

Figure 4A:
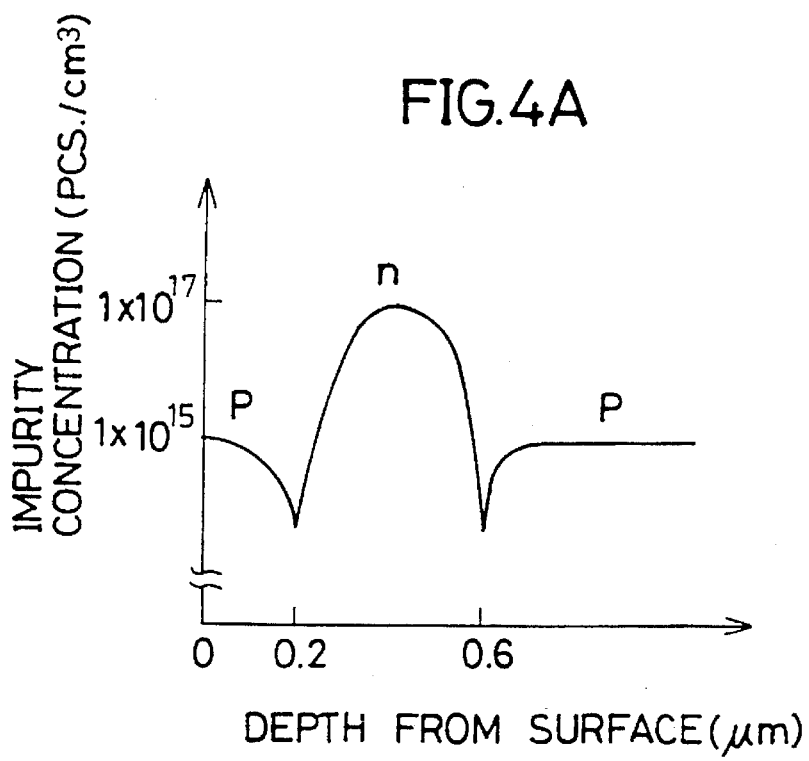
FIG. 4A is a diagram showing the state of impurity profile obtained upon ion implantation shown in FIG. 3A.
Figure 6A:
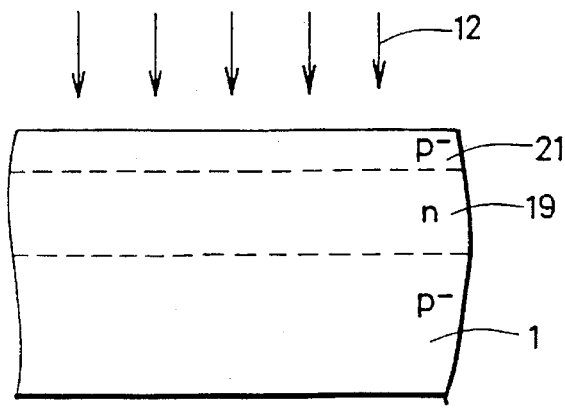
FIGS. 6A–6D are cross-sectional views showing the processing steps in another method of manufacturing the MOS field effect transistor shown in FIG. 1A.

Referring to FIG. 6A, n type impurity ions 12 (phosphorus) are implanted onto the surface of a p⁻ semiconductor substrate 1 (boron, $1\times10^{15}cm^{-3}$) with an energy of 400–500 KeV. Thereafter, a heat treatment is carried out at a temperature of 900° C. or lower for 30–60 minutes. This heat treatment results in formation in semiconductor substrate 1, an n type impurity layer 19 (phosphorus, $1\times10^{17}cm^{-3}$)

having an impurity profile to be of the maximal concentration at a deeper portion from the main surface thereof, with reference to FIGS. 6A and 4A. In this case, a p type impurity layer 21 having the same impurity concentration (boron, $1\times10^{15}cm^{-3}$) as that of semiconductor substrate 1 is left in the main surface thereof.

Figure 6B:
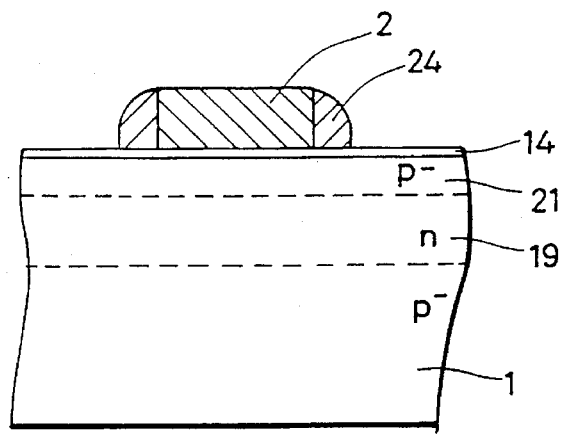

A gate oxide film 14 is then formed on semiconductor substrate 1, as shown in FIG. 6B. Thereafter, an n type polysilicon layer is deposited on gate oxide film 14 by the CVD method employing phosphine and silane gas. A subsequent patterning of the n type polysilicon layer in a predetermined form leads to formation of a gate 2. An oxide film is then deposited over the whole surface of semiconductor substrate 1 including gate 2. Thereafter, sidewall spacers 24 are formed on sidewalls of gate 2 by an etch back of the oxide film by anisotropical etching.

Figure 6C:
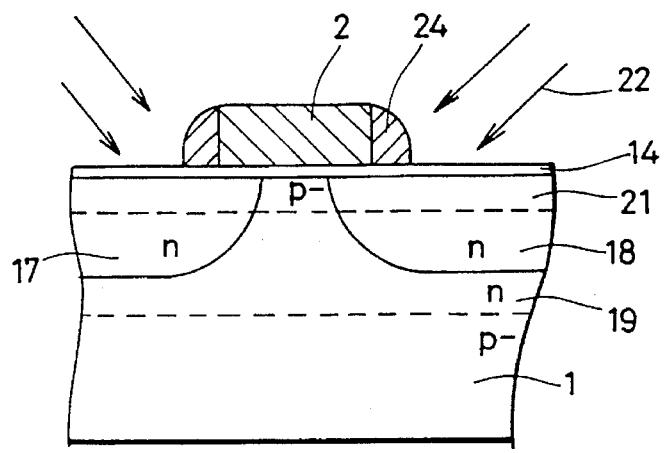

Then, referring to FIG. 6C, n type impurity ions 22 (phosphorus) are implanted onto the main surface of semiconductor substrate 1 by an oblique rotary ion implantation method, with gate 2 and sidewall spacers 24 used as mask. This implantation energy should be larger than the implantation energy employed in the step shown in FIG. 3B. This results in formation of first and second small wells 17 and 18 of n type (phosphorus, $1\times10^{17}cm^{-3}$) extending from the main surface of semiconductor substrate 1 into n type impurity layer 19. Since the impurity ions for the formation of the wells are implanted after the formation of sidewall spacers 24, first and second wells 17 and 18 can be formed deeply.

Figure 6D:
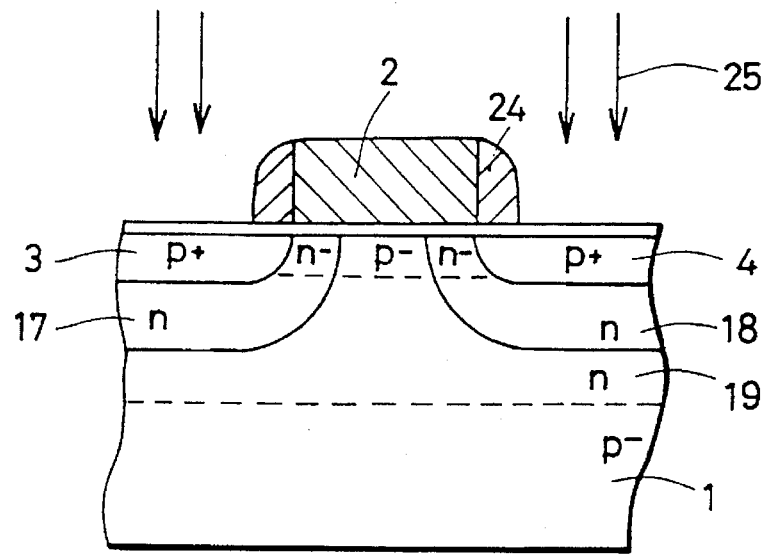

Next, referring to FIG. 6D, p type impurity ions 25 (e.g., boron) are implanted onto the overall surface of semiconductor substrate 1, whereby a p type source region 3 (boron, $1\times10^{20}cm^{-3}$) and a p type drain region 4 (boron, $1\times10^{20}cm^{-3}$) are formed in first and second wells 17 and 18, respectively.

An interlayer insulation film, not shown, is then formed over the hole surface of semiconductor substrate 1, and a contact hole is formed in this interlayer insulation film. With an aluminum interconnection formed thereafter, the MOSFET shown in FIG. 1 is obtained.

Figure 7:
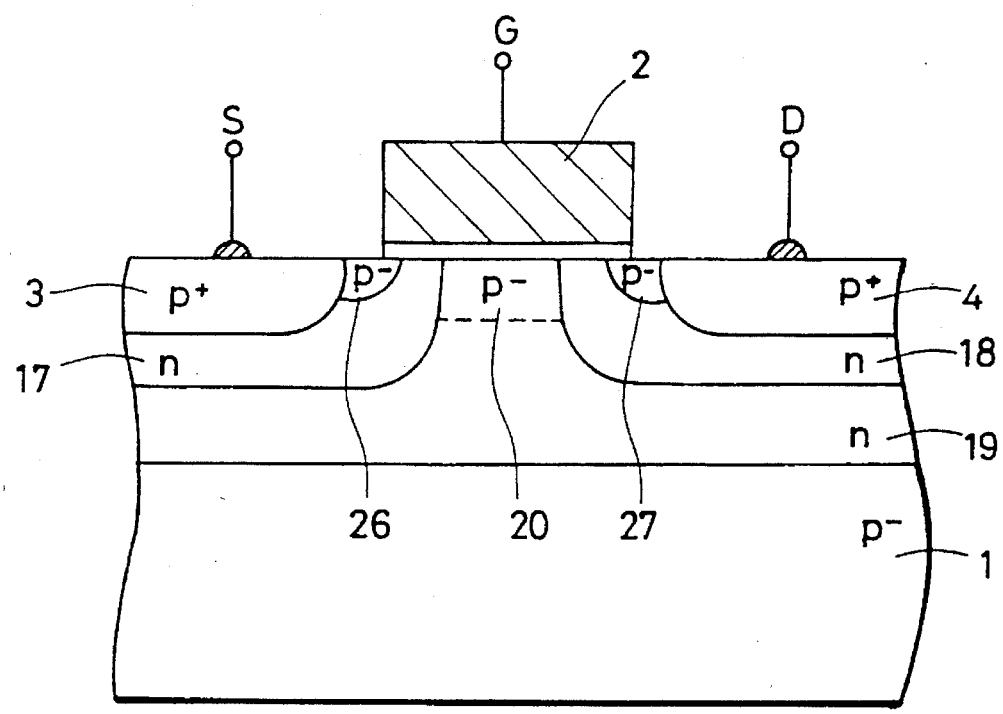
FIG. 7 is a cross-sectional view of an LDD type MOSFET according to another embodiment of the present invention.

FIG. 7 is a cross-sectional view of a MOSFET having an LDD (Lightly Doped Drain Source) structure according to another embodiment of the present invention.

Since the embodiment shown in FIG. 7 is the same as that of FIG. 1A except for the features described below, the identical or corresponding portions of FIG. 7 are denoted with the identical reference numerals, and a description thereof will not be repeated.

The MOSFET shown in FIG. 7 is different from that of FIG. 1A in that a p⁻ impurity layer 26 is formed adjacently to a source region 3 in a first small well 17, and a p⁻ impurity layer 27 is formed adjacently to a drain region 4 in a second small well 18. The p⁻ impurity layers 26 and 27 are of p⁻ concentration on the order of $10^{18}cm^{-3}$. With the MOSFET structure being of LDD type, such an effect is obtained that a resisting property to hot electrons is enhanced.

A description will now be given on a method of manufacturing the LDD type MOSFET shown in FIG. 7, with reference to FIGS. 8A–8E.

Figure 8A:
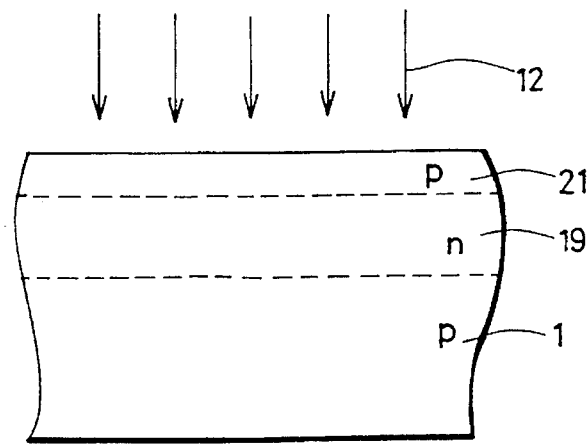
FIGS. 8A–8E are cross-sectional views showing the manufacturing steps of the LDD type MOSFET shown in FIG. 7.

Referring to FIG. 8A, n type impurity ions 12 (phosphorus) are implanted into the surface of a p type semiconductor substrate 1 (boron, $1\times10^{15}cm^{-3}$) with an energy of 400–500 KeV. Thereafter, a heat treatment is carried out at a temperature of 900° C. or lower for 30–60 minutes. This heat treatment results in formation in semiconductor substrate 1, an n type impurity layer 19 (phosphorus, $1\times10^{17}cm^{-3}$) having an impurity profile to be of the maximal concentration at a distant portion from the main surface of semiconductor substrate 1, as shown in FIGS. 8A and 4A. In this case, a p type impurity layer 21 having the same impurity concentration (boron, $1\times10^{15}cm^{-3}$) as that of semiconductor substrate 1 is left in the main surface thereof.

Figure 8B:
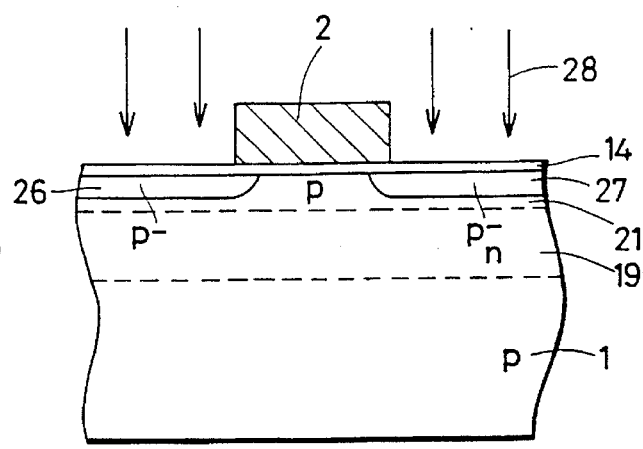

A gate oxide film 14 is then formed on semiconductor substrate 1, with reference to FIG. 8B. Thereafter, an n type polysilicon layer is deposited on gate oxide film 14 by the CVD method employing phosphine and silane gas. A subsequent patterning of this n type polysilicon layer in a predetermined form leads to formation of a gate 2. Then, impurity ions (boron) of p⁻ concentration are implanted onto the surface of semiconductor substrate 1, with gate 2 used as mask. This results in formation of p⁻ impurity layers 26 and 27 (boron, $1\times10^{18}cm^{-3}$) in the main surface of semiconductor substrate 1.

Figure 8C:
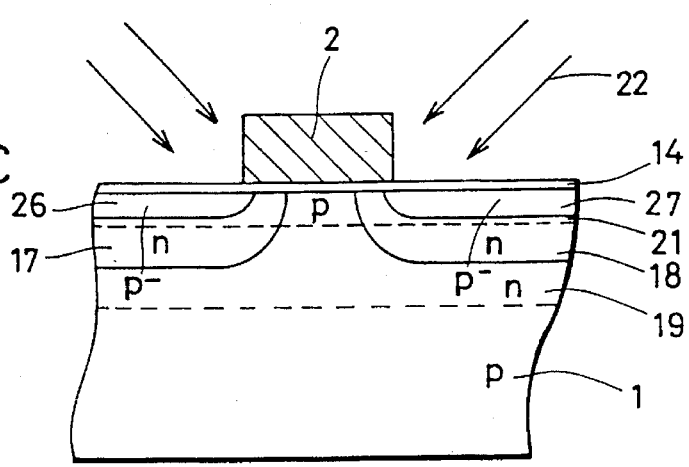

Next, referring to FIG. 8C, n type impurity ions 22 (phosphorus) are implanted onto the main surface of semiconductor substrate 1 by the oblique rotary ion implantation method, with gate used as mask. This implantation energy is 120–180 KeV. This leads to formation of first and second small wells 17 and 18 of n type (phosphorus, $1\times10^{17}cm^{-3}$) extending from the main surface of the substrate into n type impurity layer 19.

Figure 8D:
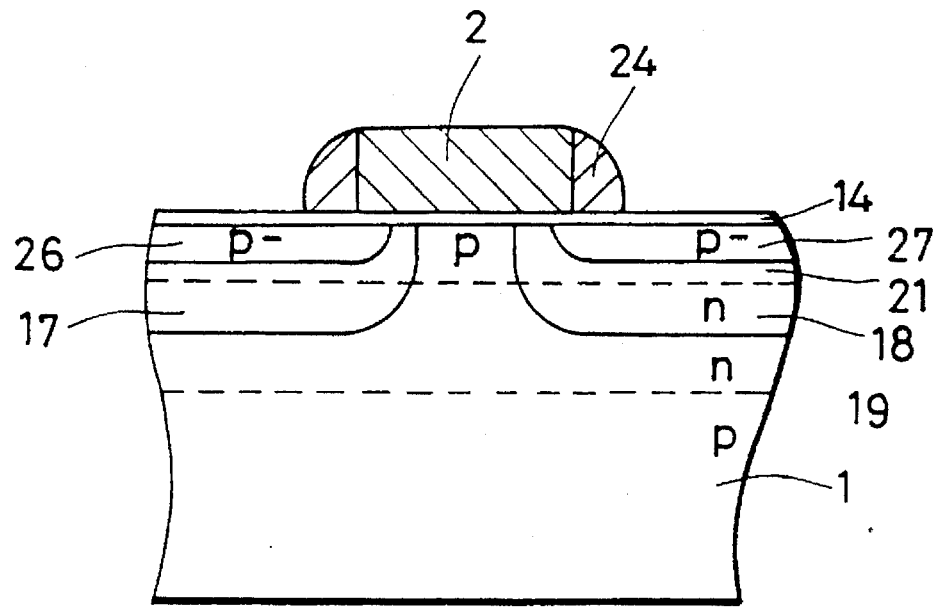
Figure 8E:
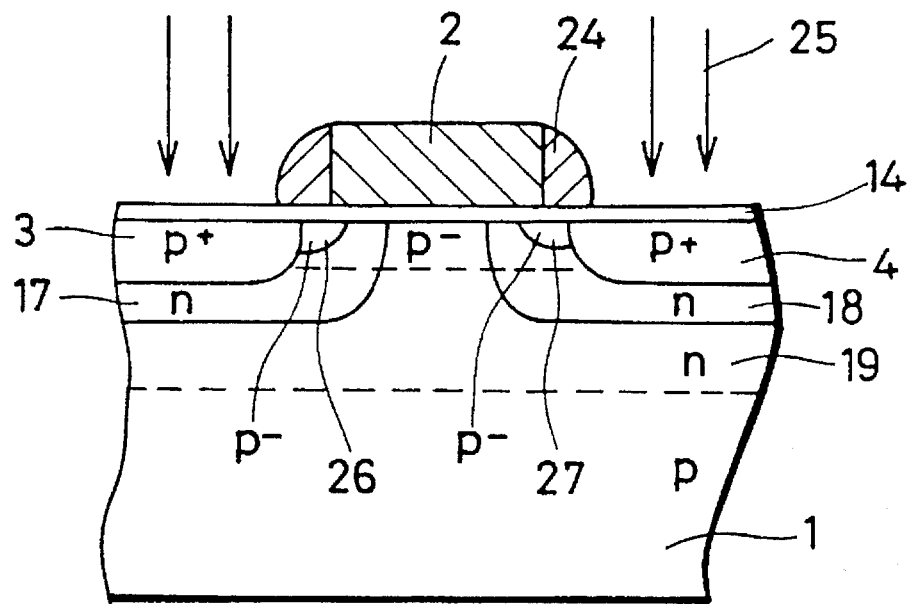

Then, an oxide film is deposited over the whole surface of semiconductor substrate 1 including gate 2, with reference to FIG. 8D. Thereafter, an etch back of this oxide film by anisotropical etching forms sidewall spacers 24 on sidewalls of gate 2.

Referring to FIG. 3E, p type impurity ions 25 are then implanted onto the overall surface of semiconductor substrate 1 with gate 2 and sidewall spacers 24 used as mask. This results in formation of a source region 3 (boron, $1\times10^{20}cm^{-3}$) adjacent to p impurity layer 26 in first well 17 and a drain region 4 (boron, $1\times10^{20}cm^{-3}$) adjacent to p⁻ impurity layer 27 in second well 18.

Then, an interlayer insulation film, not shown, is formed over the whole surface of semiconductor substrate 1, and a contact hole is then formed in this interlayer insulation film. A subsequent formation of an aluminum interconnection results in the MOSFET shown in FIG. 7.

While such a case that n type impurity layer 19 is formed on p type semiconductor substrate 1 and then n type wells 17 and 18 are formed therein is shown by way of example with reference to FIG. 1A in the foregoing embodiments, the present invention is not limited to this, and hence an n type semiconductor substrate may be employed. There is no need to form n type impurity layer 19 in this case.

Figure 9A:
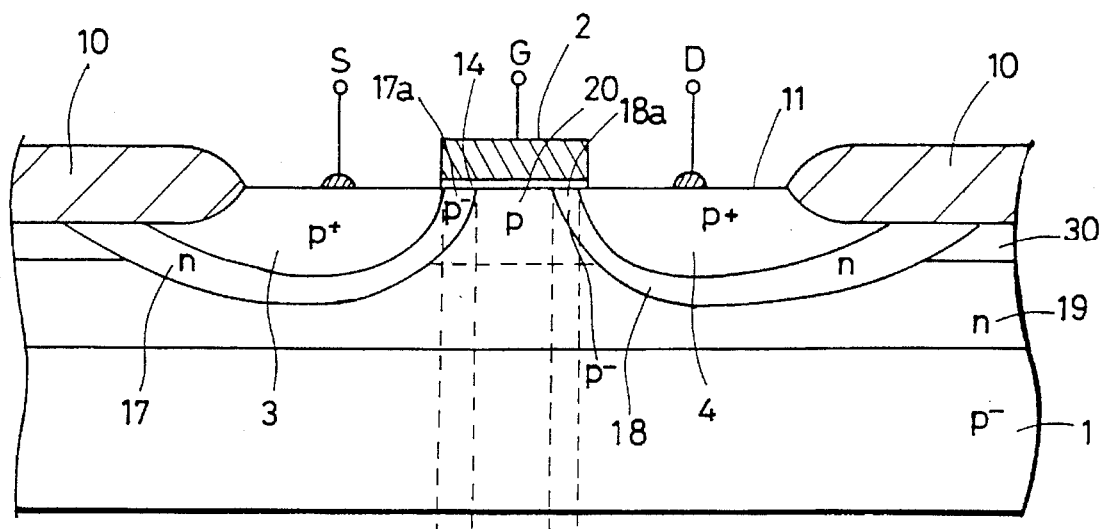
FIG. 9A is a cross-sectional view of a MOSFET according to still another embodiment of the present invention.
Figure 9B:
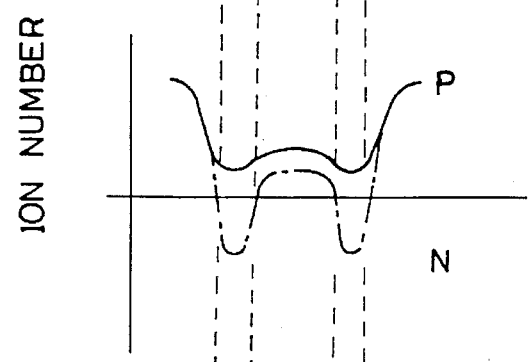
FIG. 9B is a diagram showing the distribution of the number of ions, plotted with respect to a distance in the direction of a channel length.
Figure 9C:
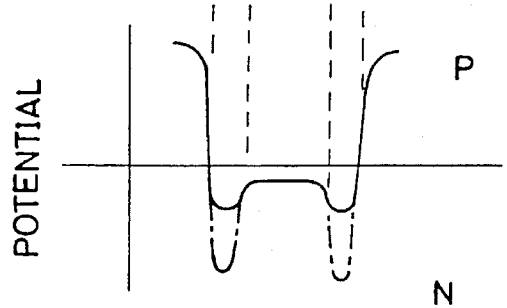
FIG. 9C is a diagram showing the distribution of potential, plotted with respect to a distance in the direction of a channel length.

FIG. 9A is a cross-sectional view of a buried channel MOSFET according to still another embodiment of the present invention; FIG. 9B is a diagram showing the distribution of the number of ions, plotted with respect to a distance in the direction of a channel length; and FIG. 9C is a diagram showing the distribution of potential, plotted with respect to a distance in the direction of the channel length.

In the embodiment shown in FIG. 1A, with reference to FIG. 1C, the potential of the channel region (regions 17a and 18a in particular) is significantly biased to n type, so that the threshold voltage $V_{TH}$ exhibits a high value, and high-speed operability cannot be obtained. The MOSFET shown in FIGS. 9A–9C is an improved MOSFET in which threshold voltage $V_{TH}$ can be lowered.

The embodiment shown in FIG. 9A is the same as that shown in FIG. 1A except the following features. The corresponding portions are denoted with the same reference numerals, and a description thereof will not be repeated.

With reference to FIGS. 9A and 9B, a central portion 20 of a channel region is of p type, and a pair of end portions 17a and 18a formed to interpose the central portion 20 therebetween is of p⁻ type. The definition of n and p has been described in the foregoing. In FIG. 9B, the curve shown by chain-dotted lines is the curve shown in FIG. 1B, which is written for a comparison with the curve shown by solid lines. With the above structure, the n type potential of the channel region is lowered, with reference to FIG. 9C. (The curve shown by chain-dotted lines is the curve shown in FIG. 1C, which is written for a comparison with the curve shown by solid lines.) As a result, threshold voltage $V_{TH}$ becomes lowered, and accordingly the channel region is liable to invert, resulting in a high-speed operability.

A description will now be made on a method of manufacturing the MOSFET shown in FIG. 9A, with reference to FIGS. 10A–10E.

Referring to 10A, p type semiconductor substrate 1 is prepared.

Figure 4B:
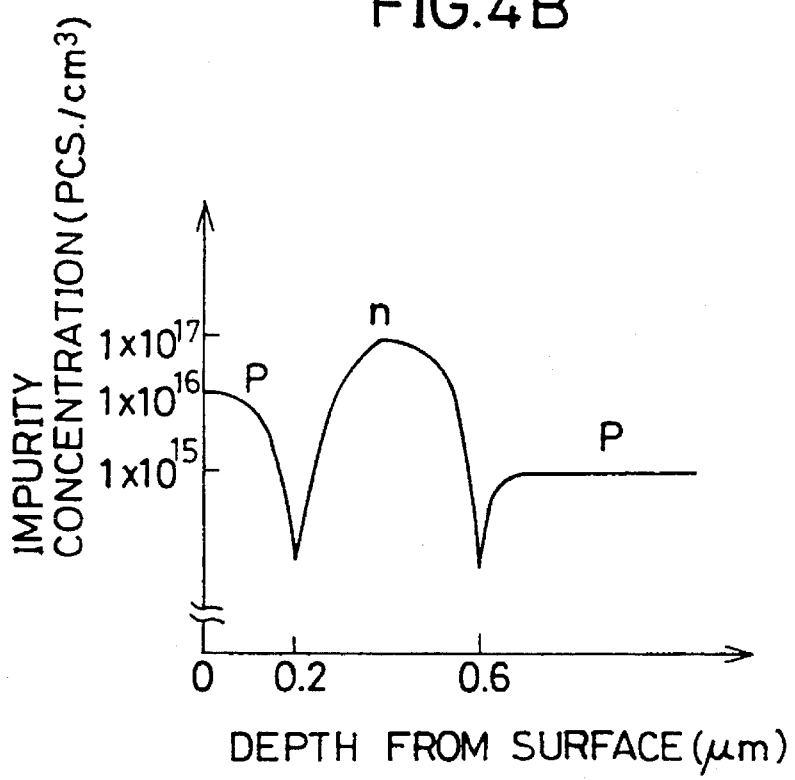
FIG. 4B is a diagram showing the state of impurity profile obtained upon ion implantation shown in FIG. 10B.
Figure 10A:
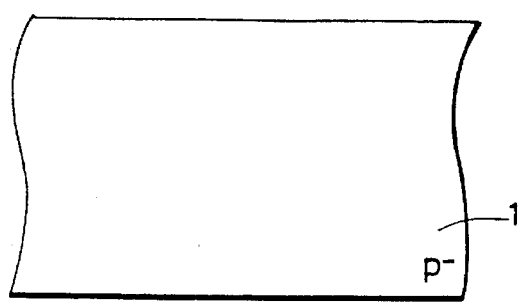
FIGS. 10A–10E are cross-sectional views showing the manufacturing steps of the MOS field effect transistor shown in FIG. 9A.
Figure 10B:
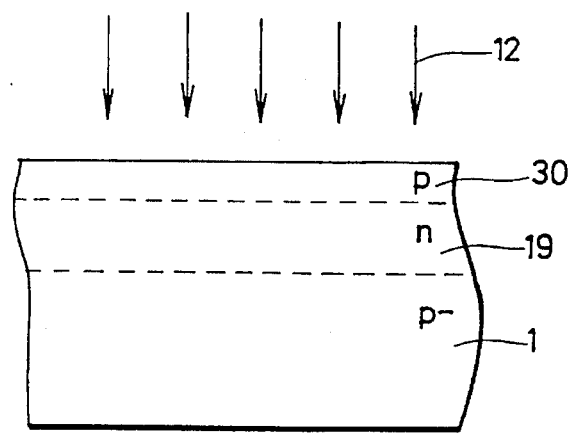

Referring to FIG. 10B, n type impurity ions 12 (phosphorus) are implanted onto the main surface of semiconductor substrate 1 with an energy of 400–500 KeV. Then, the resultant substrate undergoes a heat treatment at a temperature of 900° C. or lower for 30–60 minutes. An n type impurity layer 19 (phosphorus, $1\times10^{17}cm^{-3}$) which has an impurity profile to be the maximal concentration at a distant position from the main surface of substrate 1 is formed in semiconductor substrate 1, with reference to FIGS. 10B and 4B.

Next, P type impurity ions (boron) are implanted onto a main surface of a semiconductor substrate 1 (boron, $1\times10^{15}cm^{-3}$), to form a p type impurity layer 30 (boron, $1\times10^{16}cm^{-3}$). While the concentration of boron, $1\times10^{16}cm^{-3}$ is shown as an example, it is preferably in the range of $1\times10^{16}$–$1\times10^{17}cm^{-3}$.

Figure 10C:
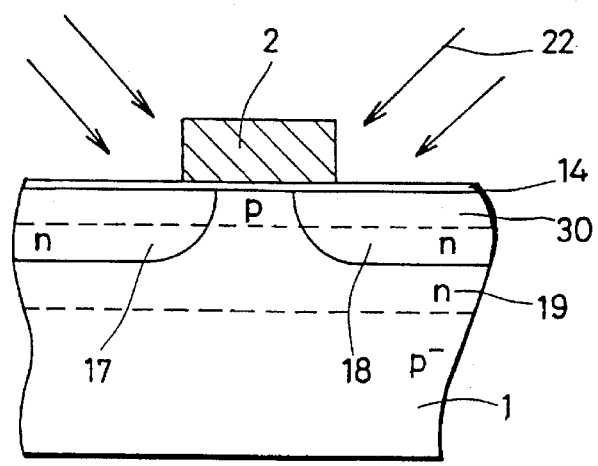
Figure 10D:
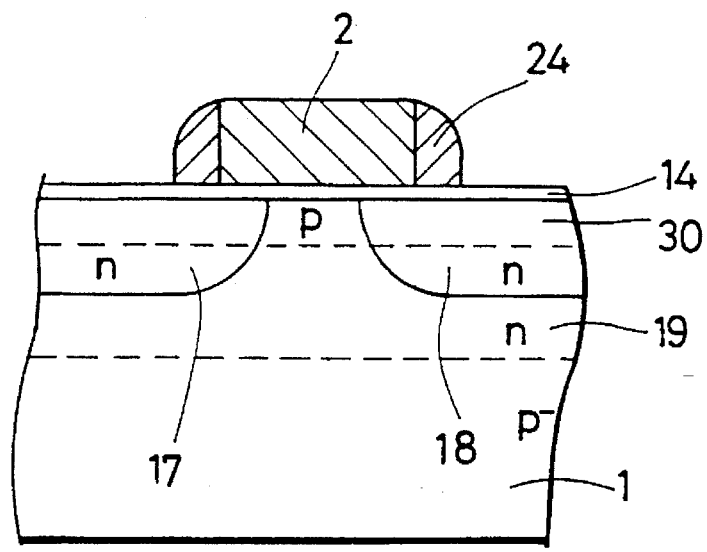
Figure 10E:
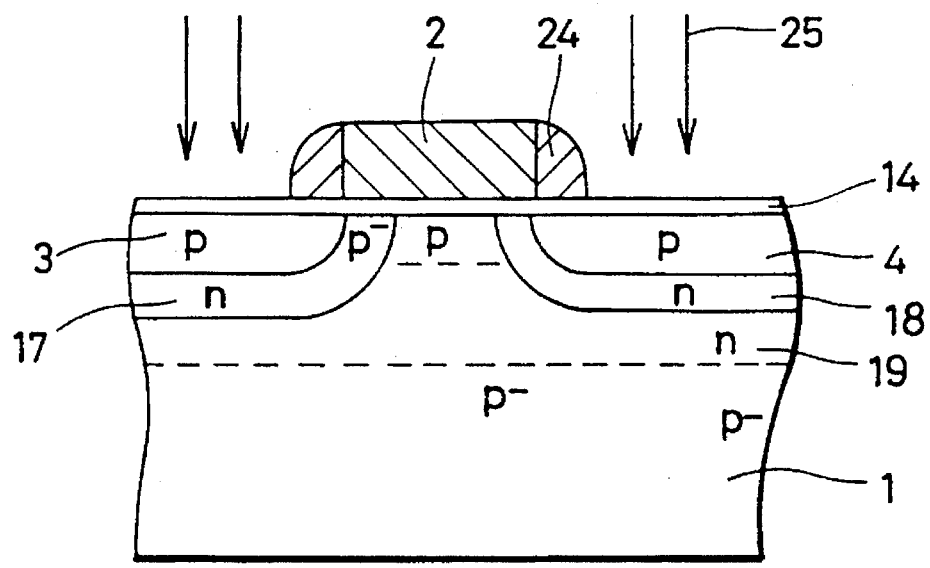
Figure 11:
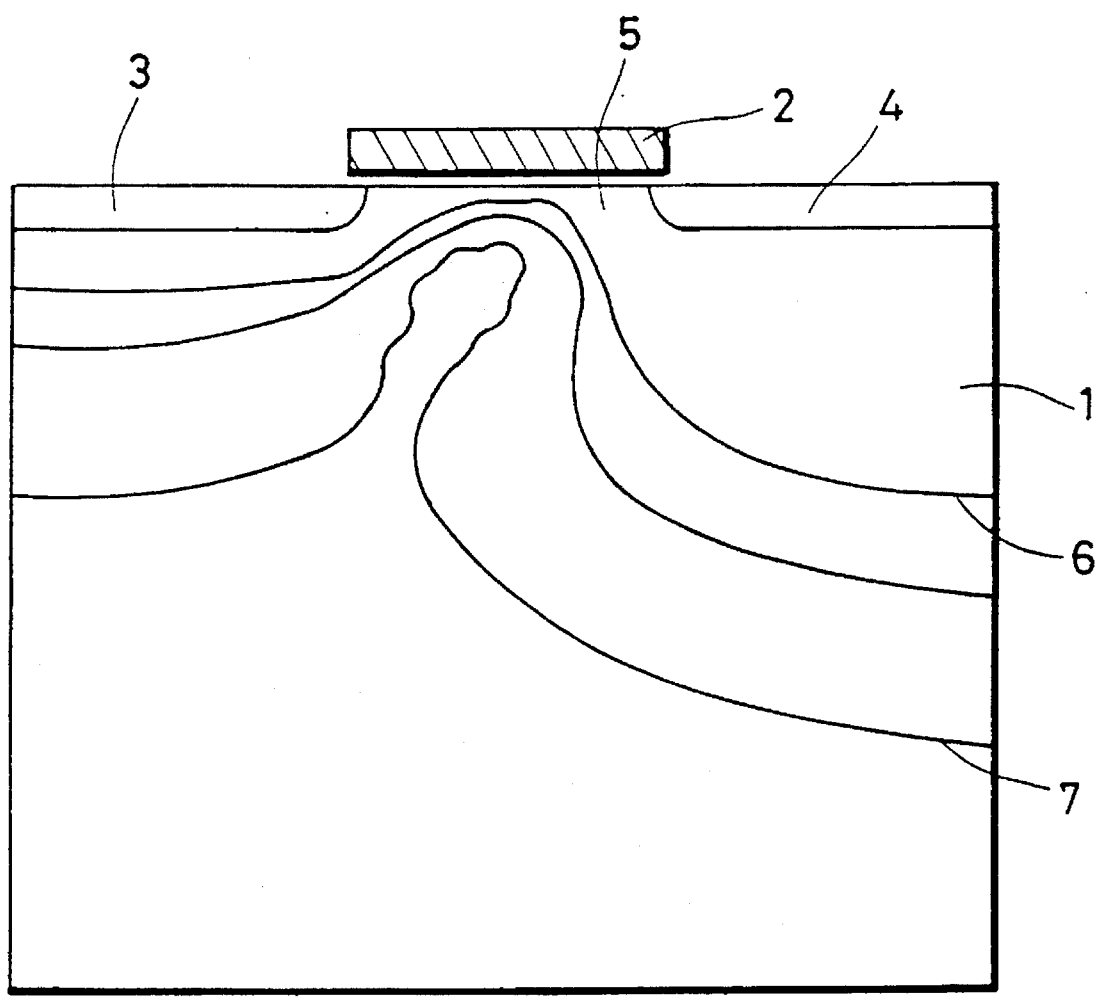
FIG. 11 is a diagram for explaining a punch-through of the MOSFET.
Figure 12A:
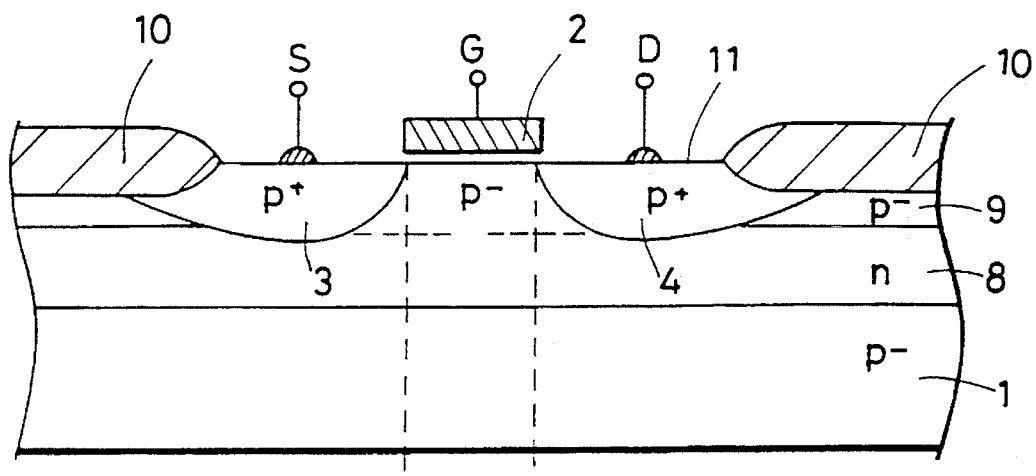
FIG. 12A is a cross-sectional view of a conventional MOS field effect transistor.
Figure 12B:
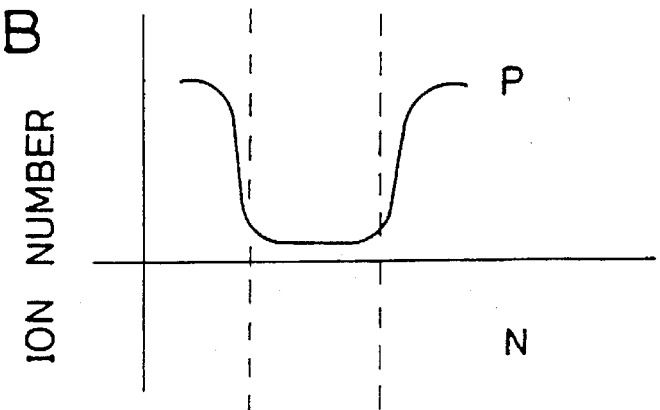
FIG. 12B is a diagram showing the distribution of the number of ions, plotted with respect to a distance in the direction of a channel length.
Figure 12C:
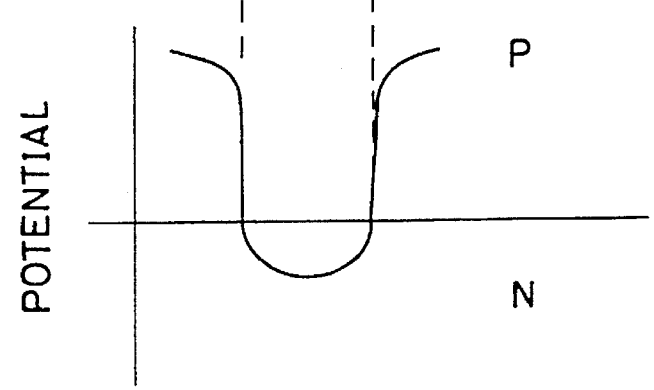
FIG. 12C is a diagram showing the distribution of potential, plotted with respect to a distance in the direction of a channel length.
Figure 13:
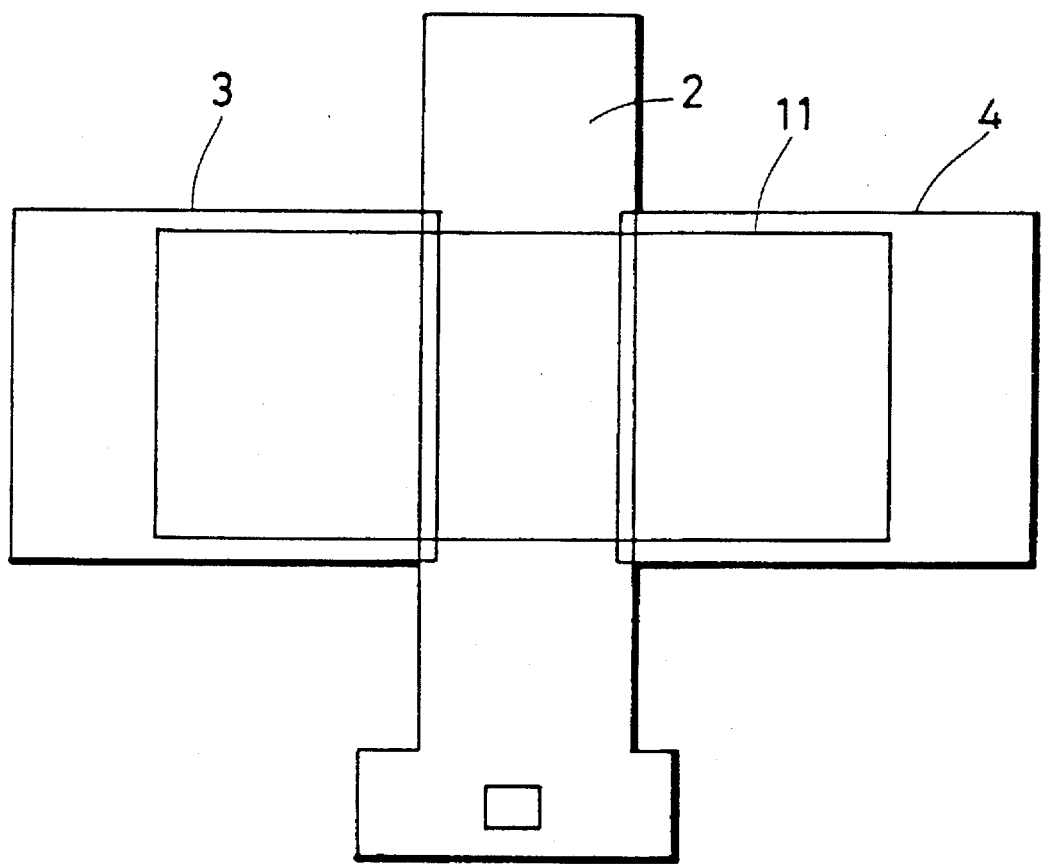
FIG. 13 is a plan view of the MOS field effect transistor shown in FIG. 12A.
Figure 14D:
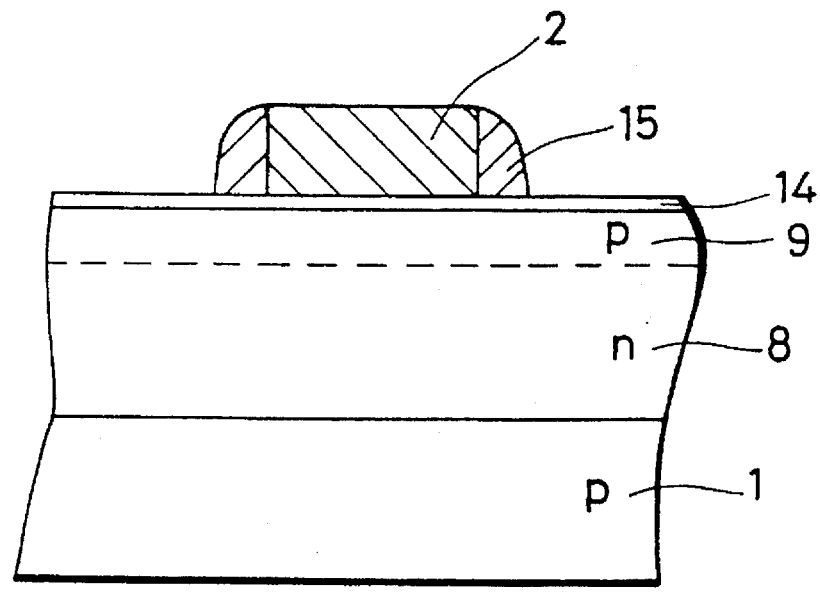
Figure 14E:
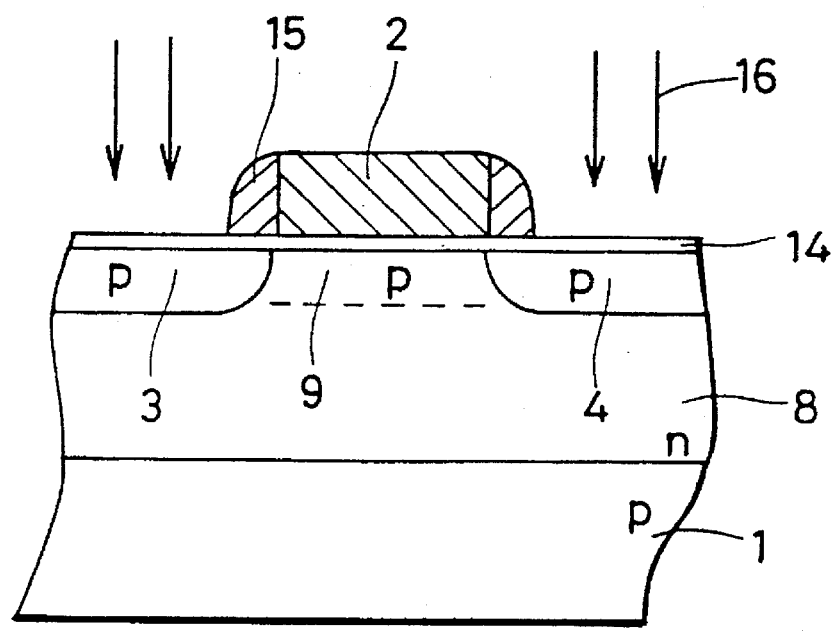

A gate oxide film 14 is thereafter formed on semiconductor substrate 1, with reference to FIG. 10C. An n type polysilicon layer is then deposited on gate oxide film 14 by employing the CVD method using phosphine and silane gas (not shown). A subsequent patterning of this n type polysilicon layer in a predetermined form causes formation of a gate 2. Then, n type impurity ions 22 (phosphorus) are implanted onto the main surface of semiconductor substrate 1 by employing the oblique rotary ion implantation method, with gate 2 used as mask. The implantation energy at this time is 120–180 KeV. This results in formation of first and second small wells 17 and 18 of n type (phosphorus, $1\times10^{17}cm^{-3}$) extending from the main surface of substrate 1 into n type impurity layer 19. The oblique rotary ion implantation is carried out by the method shown in FIG. 5. An oxide film is then deposited over the entire surface of semiconductor substrate 1 including gate 2 (not shown), with reference to FIG. 10D. Thereafter, an etch back of this oxide film by anisotropical etching causes sidewall spacers 24 to be formed on sidewalls of gate 2. p type impurity ions 25 (boron) are implanted onto the overall surface of semiconductor substrate 1, to form a p type source region 3 (boron, $1\times10^{20}cm^{-3}$) and a p type drain region 4 (boron, $1\times10^{20}cm^{-3}$) in first and second wells 17 and 18, respectively, with reference to FIG. 10E.

Then, an interlayer insulation film, not shown, is formed over the entire surface of semiconductor substrate 1, and a contact hole is formed in this interlayer insulation film. After that, an aluminum interconnection is formed, and the MOSFET is formed.

As has been described heretofore, in the MOSFET according to the first aspect of the present invention, since the wells to be formed for preventing the punch-through are so small as to accommodate only the source/drain regions, the high-temperature heat treatment, which has been conventionally required to form large wells, becomes no longer required. Accordingly, no distortion due to thermal stresses remains in the resultant MOSFET. Consequently, the MOSFET becomes a highly reliable device.

In the MOSFET according to the second aspect of the present invention, since the conductivity type of the central portion of the channel region is more biased to p type than that of the end portions, a high-speed operability is partially enhanced at the central portion of the channel region, resulting in enhancement in high-speed operability of the transistor as a whole.

In accordance with the MOSFET manufacturing method according to the third aspect of the present invention, since the wells to be formed to prevent the punch-through are so small as to accommodate only the source/drain regions, the high-temperature heat treatment processing step, which has conventionally been required to form large wells, becomes no longer required. This makes it possible to inhibit the occurrence of distortion in the semiconductor substrate and thus to cause no difference in characteristics of the device between the central portion and the peripheral portion of the semiconductor substrate, resulting in enhancement in yield of the device.

In accordance with the MOSFET manufacturing method according to the fourth aspect of the present invention, the second conductivity type impurity ions are implanted into the main surface of the semiconductor substrate with such an energy as to provide the impurity profile to be of the maximal concentration at a distant portion from the main surface thereof, whereby the second conductivity type impurity layer is formed in the semiconductor substrate. Thus, the first conductivity type impurities are left at the main surface of the substrate. Accordingly, the step of implanting the impurity ions for threshold value setting becomes no longer required, leading to simplification of the entire processing step.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. The MOS field effect transistor, comprising:

a semiconductor substrate having a main surface;

an n type gate formed on said semiconductor substrate;

a pair of p type source/drain regions formed on the main surface of said semiconductor substrate and on opposite sides of said gate; and a channel region formed on the main surface of said semiconductor substrate and directly beneath said gate;

wherein said channel region being divided into a central portion and a pair of end portions formed to interpose the central portion therebetween, and said central portion is of a p type conductivity, and said end portions are of a p⁻ type conductivity.

* * * * *